US008836880B2

(12) United States Patent
Takama et al.

(10) Patent No.: US 8,836,880 B2
(45) Date of Patent: Sep. 16, 2014

(54) DEVICES AND METHODS FOR DISPLAYING AN IMAGE AT A FRAME REGION OF A DISPLAY PANEL

(76) Inventors: Daisuke Takama, Kanagawa (JP); Takeo Koito, Kanagawa (JP)

( * ) Notice: Subject to any disclaimer, the term of this patent is extended or adjusted under 35 U.S.C. 154(b) by 112 days.

(21) Appl. No.: 13/542,783

(22) Filed: Jul. 6, 2012

(65) Prior Publication Data

US 2013/0016299 A1    Jan. 17, 2013

(30) Foreign Application Priority Data

Jul. 13, 2011 (JP) ................. 2011-154971

(51) Int. Cl.
*G02F 1/1333* (2006.01)
*G02F 1/1335* (2006.01)
*H01L 51/52* (2006.01)

(52) U.S. Cl.
CPC .... *G02F 1/133512* (2013.01); *G02F 1/133526* (2013.01); *H01L 51/5275* (2013.01); *G02F 2001/133562* (2013.01)
USPC ................. 349/57; 349/58; 349/95

(58) Field of Classification Search
CPC ............ G02F 1/133526; G02F 1/133308; G02F 1/133608; G02F 1/13452; G02F 1/133621; G02F 1/133512; G02F 2001/133617; G02B 6/0053
USPC ................. 349/57, 58, 95
See application file for complete search history.

(56) References Cited

U.S. PATENT DOCUMENTS

| | | | | |
|---|---|---|---|---|
| 6,424,326 B2 * | 7/2002 | Yamazaki et al. | ............... | 345/77 |
| 6,855,961 B2 * | 2/2005 | Maruyama et al. | ............. | 257/99 |
| 6,864,951 B1 * | 3/2005 | Ren et al. | ...................... | 349/200 |
| 7,067,395 B2 * | 6/2006 | Maruyama et al. | ........... | 438/455 |
| 7,319,436 B2 * | 1/2008 | Tomisawa | ......................... | 345/6 |
| 8,572,893 B2 * | 11/2013 | Watanabe | ......................... | 49/64 |
| 2011/0310488 A1 * | 12/2011 | Tomotoshi et al. | ........... | 359/601 |

FOREIGN PATENT DOCUMENTS

| | | | |
|---|---|---|---|
| JP | 2007-052323 A | | 3/2007 |
| JP | 2010-015094 A | | 1/2010 |
| JP | 2010015094 A | * | 1/2010 |
| JP | 2011-047974 A | | 3/2011 |
| WO | 2009/066436 A1 | | 5/2009 |
| WO | 2010/089998 A1 | | 8/2010 |
| WO | 2010/140537 A1 | | 12/2010 |

* cited by examiner

*Primary Examiner* — Mike Qi
(74) *Attorney, Agent, or Firm* — Wolf, Greenfield & Sacks, P.C.

(57) ABSTRACT

There are provided a display that achieves a smaller frame size than in the past, a method of manufacturing the display, and an electronic unit including the display. The display includes: a display panel having an effective display region and a frame region located at the periphery of the effective display region; and a lens component provided on a viewing surface side of the display panel, the lens component having a lens function section in part or all of a circumferential region thereof. A visible outline on a lens-function-section side of the lens component is disposed outside a visible outline of the frame region of the display panel.

9 Claims, 13 Drawing Sheets

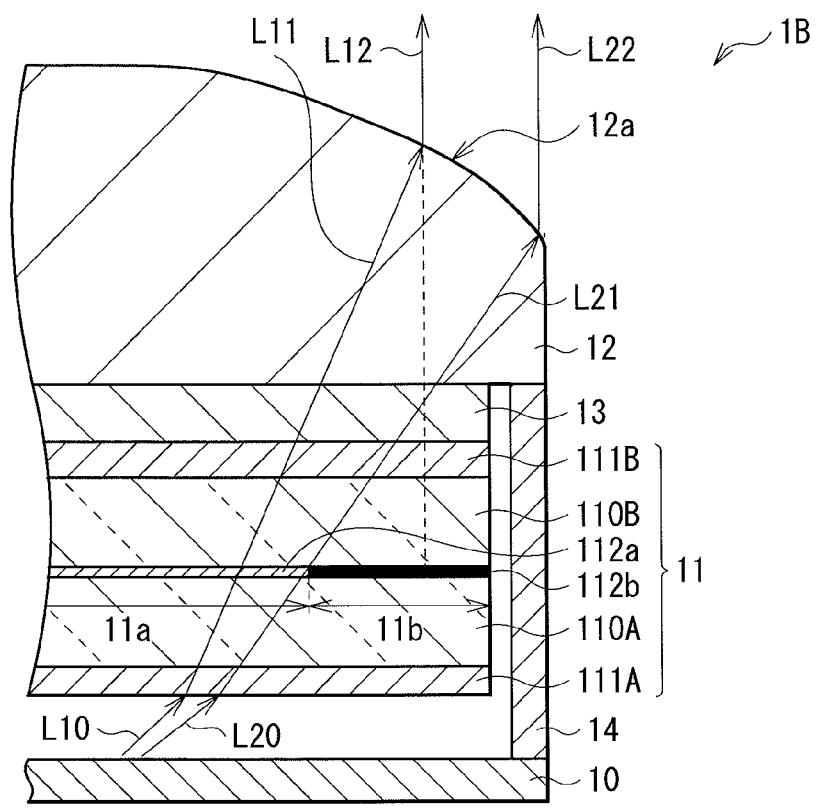
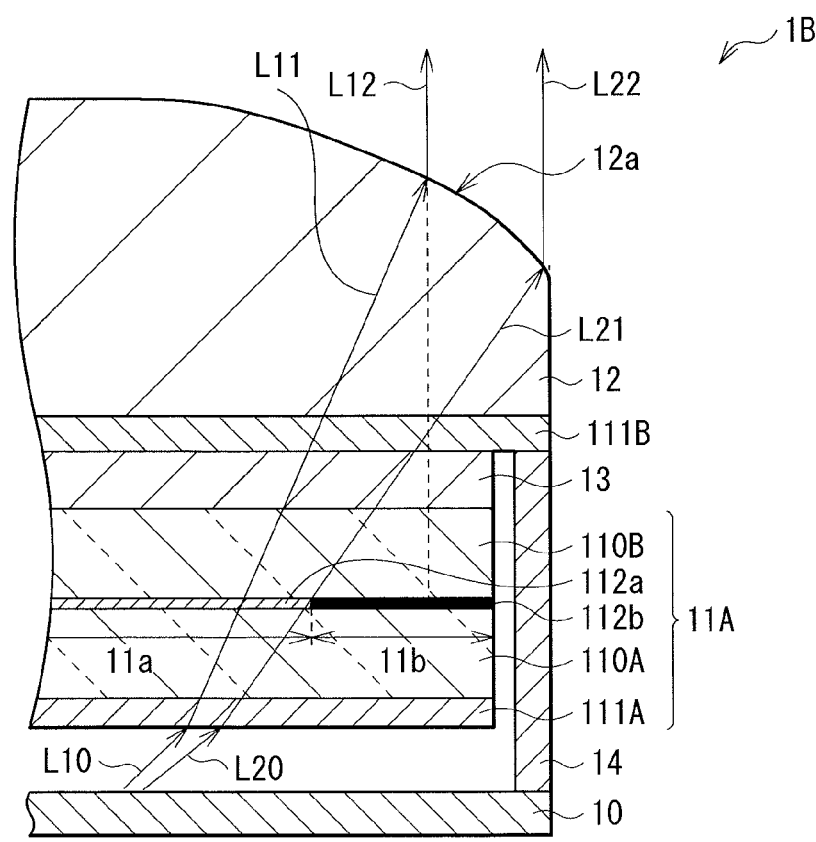

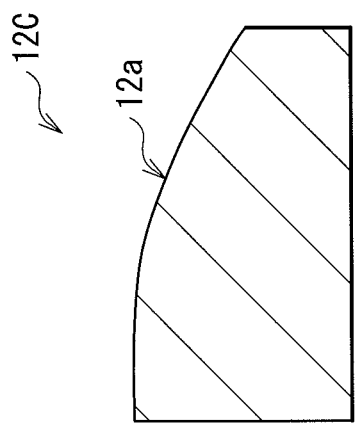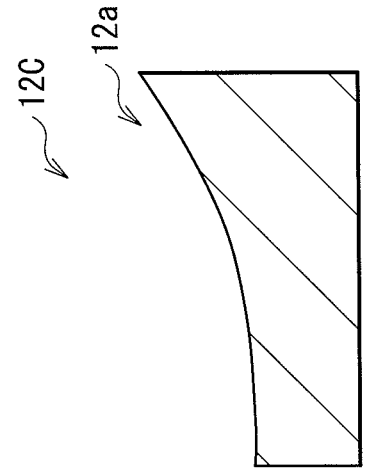
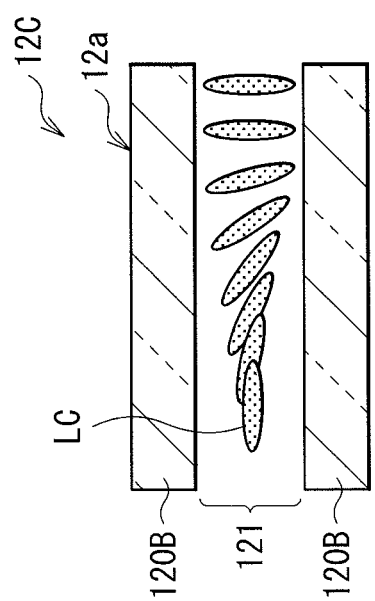
FIG. 8A
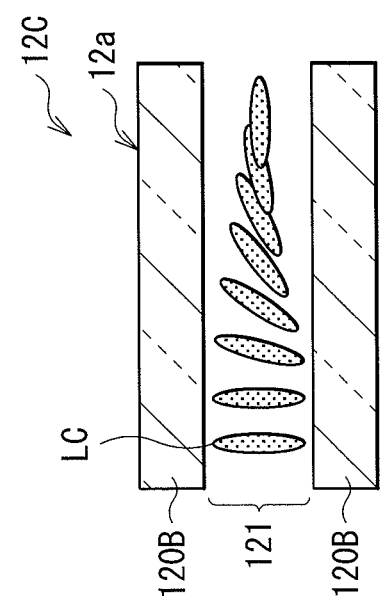
FIG. 8B

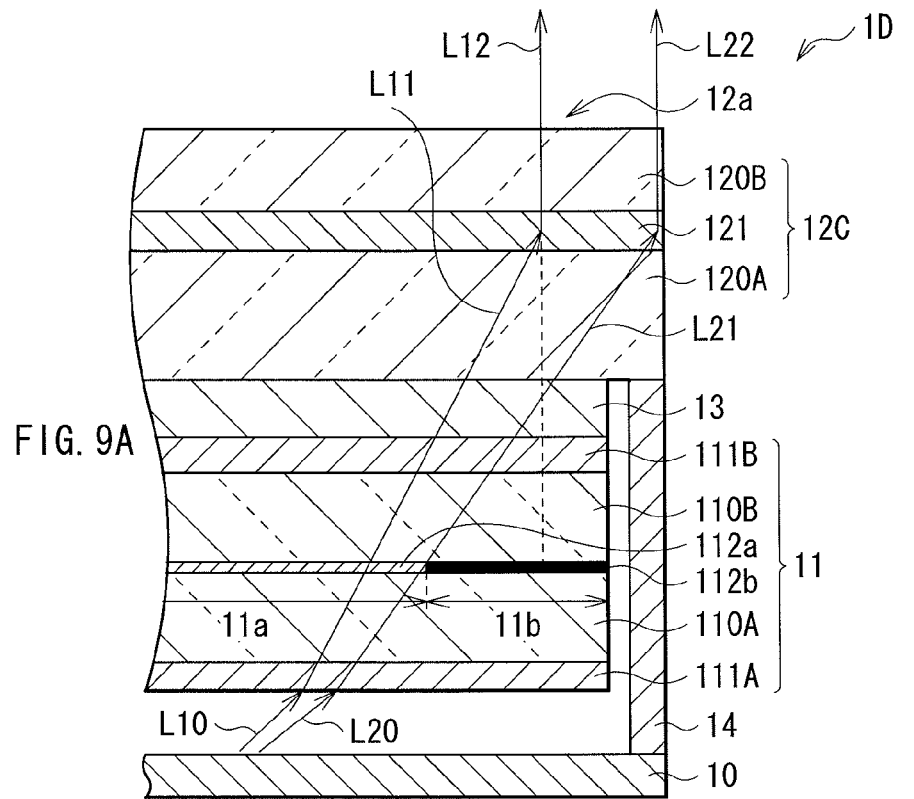
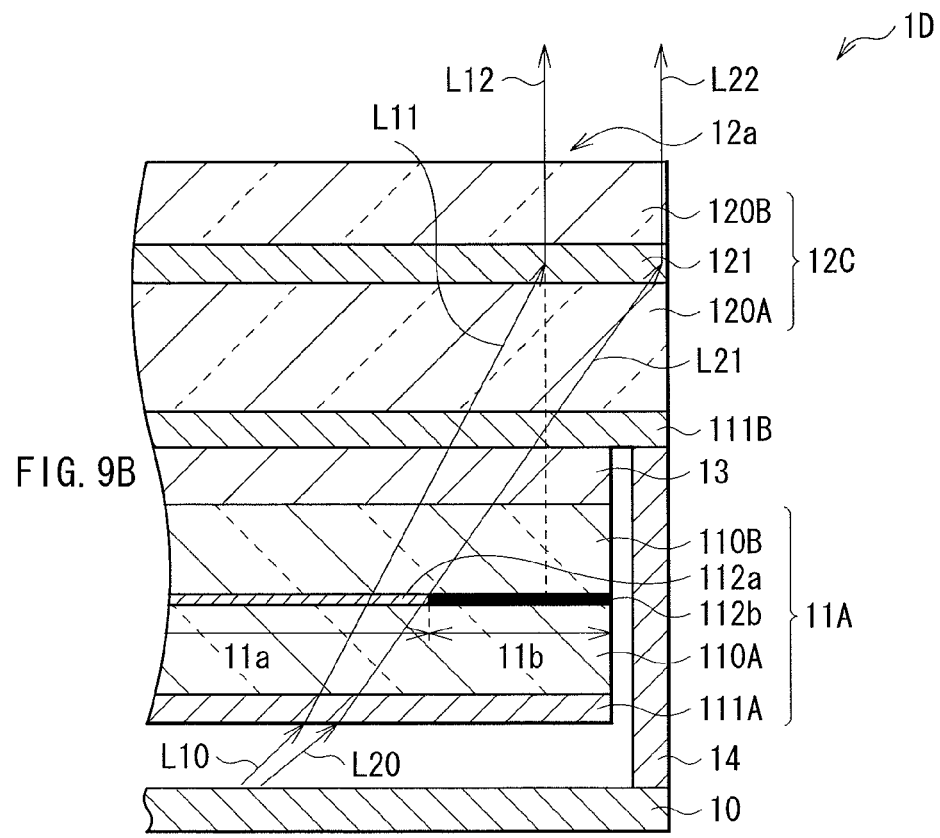

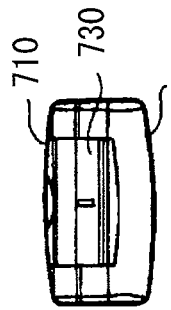
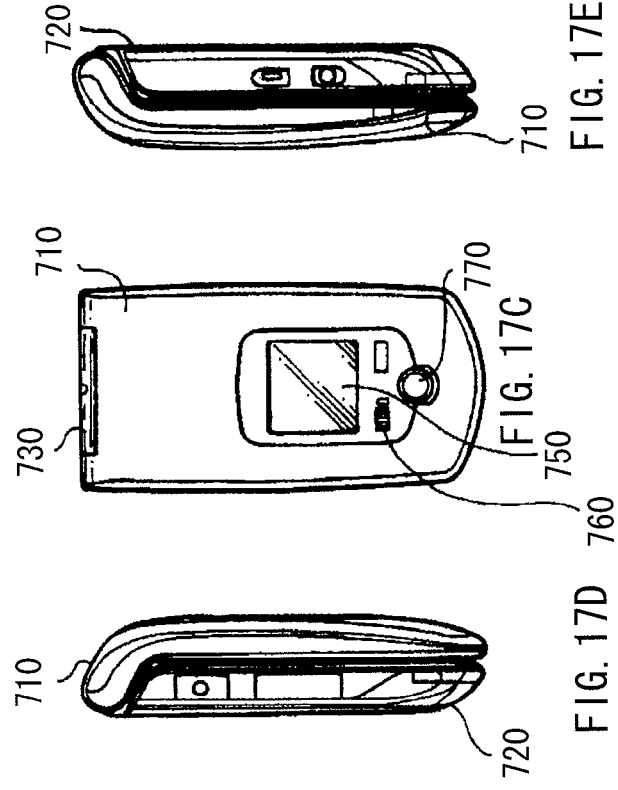
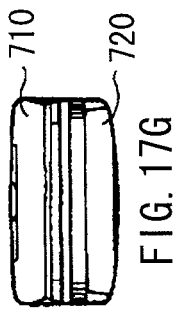
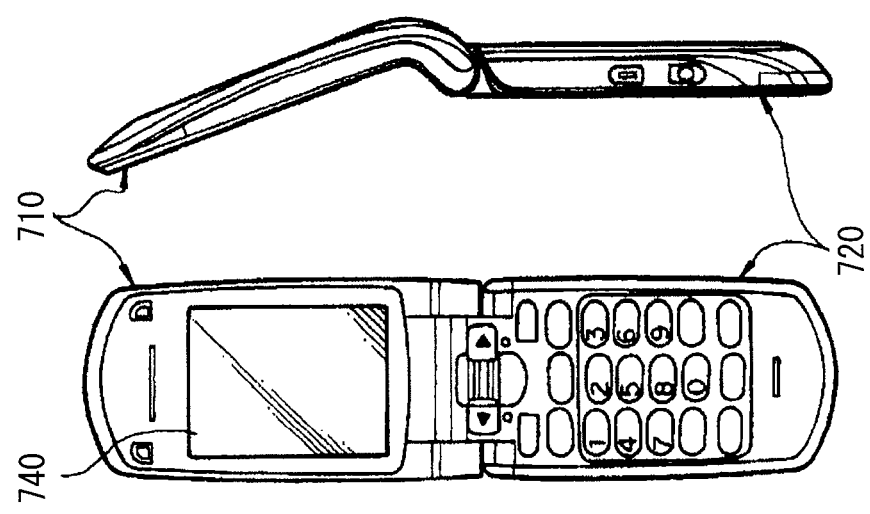

DEVICES AND METHODS FOR DISPLAYING AN IMAGE AT A FRAME REGION OF A DISPLAY PANEL

BACKGROUND

The present disclosure relates to a display including a display panel and a lens component on a viewing surface side of the display panel, and a method of manufacturing the display, and an electronic unit including the display.

In a recent trend, electronic units are progressively reduced in size. On the other hand, strong demand exists for upsizing of displays, resulting in a need of frame-size reduction of a display (display panel) itself in order to respond to the trend of size reduction of electronic units. However, a display panel having a frame width of less than 1 mm has been developed; hence, physical frame-size reduction is approaching the limit.

To solve such a difficulty, a method has been proposed, where a lens component is disposed on a viewing surface side of a display panel to achieve pseudo frame-size reduction (for example, see Japanese Unexamined Patent Application Publication No. 2010-15094 (JP-A-2010-15094)).

The method disclosed in JP-A-2010-15094 achieves certain frame-size reduction (pseudo frame-size reduction). However, in view of the recent trend as described above, it is desirable to propose a method that achieves further frame-size reduction.

It is desirable to provide a display that achieves a smaller frame size than in the past, a method of manufacturing the display, and an electronic unit including the display.

SUMMARY

According to an embodiment of the disclosure, there is provided a display including: a display panel having an effective display region and a frame region located at the periphery of the effective display region; and a lens component provided on a viewing surface side of the display panel, the lens component having a lens function section in part or all of a circumferential region thereof. A visible outline on a lens-function-section side of the lens component is disposed outside a visible outline of the frame region of the display panel.

According to an embodiment of the disclosure, there is provided a method of manufacturing a display including: forming a display panel having an effective display region and a frame region located at the periphery of the effective display region; and forming a lens component on a viewing surface side of the display panel, the lens component having a lens function section in part or all of a circumferential region thereof. A visible outline on a lens-function-section side of the lens component is disposed outside a visible outline of the frame region of the display panel.

According to an embodiment of the disclosure, there is provided an electronic unit including a display, the display including: a display panel having an effective display region and a frame region located at the periphery of the effective display region; and a lens component provided on a viewing surface side of the display panel, the lens component having a lens function section in part or all of a circumferential region thereof. A visible outline on a lens-function-section side of the lens component is disposed outside a visible outline of the frame region of the display panel.

In the display, the method of manufacturing the display, and the electronic unit according to the embodiments of the disclosure, display light emitted from the effective display region is changed in an optical path by the lens function section of the lens component, and then emitted to the outside (a function of pseudo frame-size reduction). The visible outline on the lens-function-section side of the lens component is disposed outside the visible outline of the frame region of the display panel. Consequently, an optical path of display light, which is emitted from a frame region side of the effective display region, is readily changed into a direction toward a region close to a viewer by the lens function section. Specifically, the display light is changed in an optical path by the lens component (the lens function section) and thus generally readily arrives at a region close to a viewer regardless of an emission source site in the effective display region.

According to the display, the method of manufacturing the display, and the electronic unit according to the embodiments of the disclosure, the visible outline on the lens-function-section side of the lens component is disposed outside the visible outline of the frame region of the display panel; hence, display light emitted from the effective display region is generally allowed to readily arrive at a region close to a viewer. This enhances a function of pseudo frame-size reduction by the lens function section, thus achieving a smaller frame size than in the past.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIGS. 6A and 6B are each a sectional view illustrating an exemplary detailed configuration of the display shown in FIG. 5.

FIGS. 8A and 8B are each a sectional view schematically illustrating an exemplary detailed configuration of a lens component shown in FIGS. 7A and 7B.

FIGS. 9A and 9B are each a sectional view illustrating an exemplary configuration of a display according to Modification 4.

FIGS. 17A and 17B are a front view and a side view of an application example 5 in an open state, respectively, and FIGS. 17C to 17G are a front view, a left side view, a right side view, a top view, and a bottom view of the application example 5 in a closed state, respectively.

DETAILED DESCRIPTION OF EMBODIMENT

Hereinafter, an embodiment of the disclosure will be described in detail with reference to the accompanying drawings. It is to be noted that description is made in the following order.
1. Embodiment (Example 1 of liquid crystal display)
2. Modifications
   Modification 1 (Example 2 of liquid crystal display, including an emission-side polarizing plate in a region close to a lens component)
   Modification 2 (Example 3 of liquid crystal display, including a lens component supported by an outer casing)
   Modification 3 (Example 4 of liquid crystal display, including a lens component including a liquid crystal lens (first type))
   Modification 4 (Example 5 of liquid crystal display, including a lens component including a liquid crystal lens (second type))
   Modification 5 (Example 1 of organic electro luminescence (EL) display)
   Modification 6 (Example 2 of organic EL display, including a lens component including a liquid crystal lens)
   Modification 7 (Example of display having lens functional sections in regions close to all sides of a lens component)
3. Application examples (application examples of display to electronic units)
4. Other Modifications Embodiment

[Configuration of Liquid Crystal Display 1]

Figure 1:
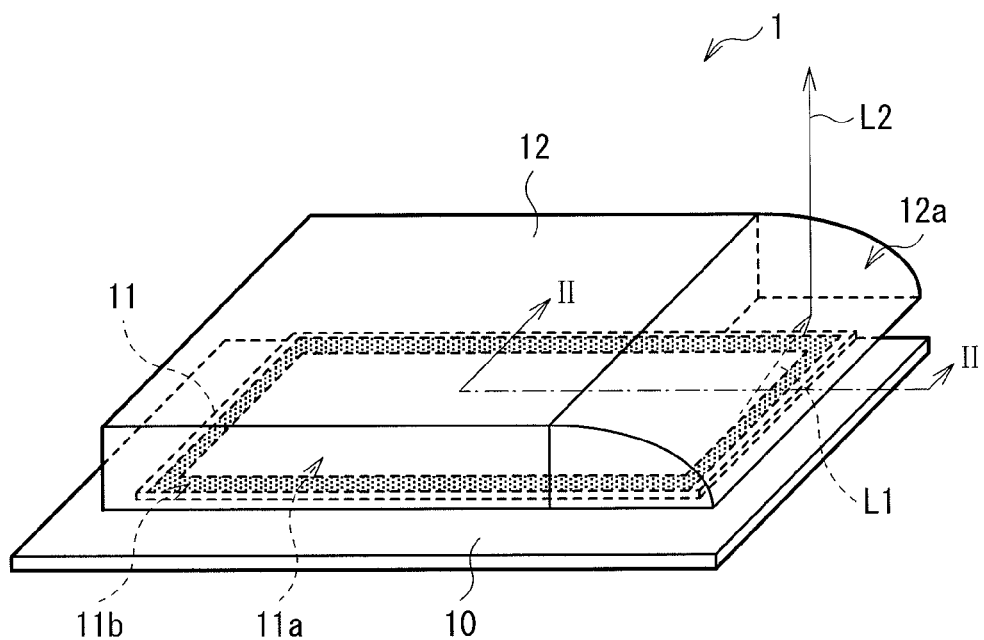
FIG. 1 is a perspective view illustrating an exemplary appearance configuration of a display according to an embodiment of the disclosure.
Figure 2:
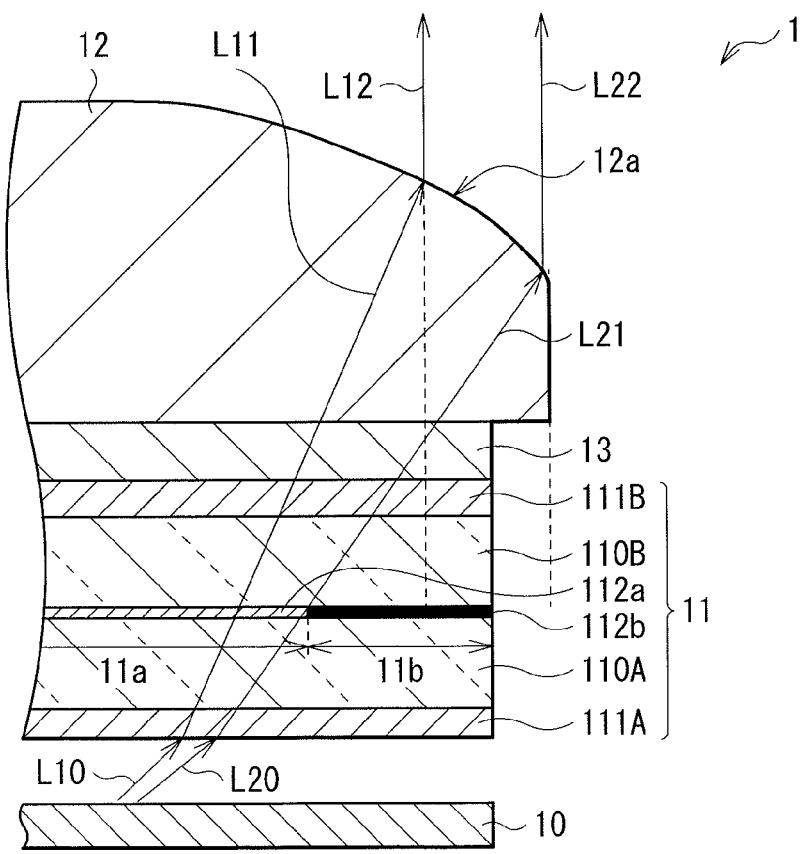
FIG. 2 is a sectional view illustrating an exemplary detailed configuration of the display shown in FIG. 1.

FIG. 1 is a perspective view schematically illustrating an appearance configuration of a display (liquid crystal display 1) according to an embodiment of the disclosure. FIG. 2 illustrates an exemplary sectional configuration (exemplary sectional configuration as viewed in an arrow direction along a II-II line in FIG. 1) of the liquid crystal display 1.

As shown in FIG. 1, the liquid crystal display 1 includes a backlight 10, a liquid crystal display panel 11, and a lens component 12 in this order from a back side to a side of a viewing surface (display surface, or front surface) of the liquid crystal display 1. As shown in FIG. 2, the liquid crystal display 1 further includes a resin layer 13 between the liquid crystal display panel 11 and the lens component 12.

The backlight 10 is provided on a back side of the liquid crystal display panel 11, and applies light to the liquid crystal display 1 as a light source section. For example, such a backlight 10 includes a light source (not shown) such as a cold cathode fluorescent lamp (CCFL) and a light emitting diode (LED), and various types of optical sheets (not shown).

(Liquid Crystal Display Panel 11)

The liquid crystal display panel 11 is a display panel including liquid crystal devices, and as shown in FIG. 1, includes an effective display region 11a including a plurality of pixels (not shown), and a frame region (non-display region) 11b located at the periphery (circumference) of the effective display region 11a. In addition, the liquid crystal display panel 11 has a stacked structure including a polarizing plate 111A (an incident-side polarizing plate), a substrate 110A, a liquid crystal layer 112a and a light-shielding layer 112b, a substrate 110B, and a polarizing plate 111B (an emission-side polarizing plate) from a back side (backlight 10 side) to a viewing surface side (lens component 12 side) of the liquid crystal display panel 11 (see FIG. 2).

The substrates 110A and 110B (a pair of substrates) are each a light-transmissive substrate, and configured using, for example, a glass substrate. The substrate 110A functions as a TFT substrate having undepicted devices such as thin film transistors (TFTs) and undepicted wirings. On the other hand, the substrate 110B functions as a CF substrate having a color filter (CF) and a black matrix (BF).

The polarizing plates 111A and 111B are each an optical device having a function of selectively transmitting a particular polarization component of incident light, and absorbing other polarization components. The polarizing plates 111A and 111B are disposed with orthogonal transmission axes thereof (crossed Nichol arrangement) or with parallel transmission axes thereof (parallel Nichol arrangement).

The liquid crystal layer 112a is interposed between the substrates 110A and 110B, and defines the liquid crystal devices in the effective display region 11a. The light-shielding layer 112b is provided in the frame region 11b. It is to be noted that the frame region 11b has various peripheral circuits such as a drive circuit.

The resin layer 13 functions as an adhesive layer for adhesion of the liquid crystal display panel 11 to the lens component 12, and includes a resin material such as acrylic resin. It is to be noted that an air layer (a gap layer) may be provided between the liquid crystal display panel 11 and the lens component 12 instead of such a resin layer 13. The same holds true below.

(Lens Component 12)

The lens component 12 is disposed on a viewing surface side of the liquid crystal display panel 11, and has a lens function section 12a in part or all of a circumferential region (outer-end region) of the lens component 12. In detail, in this embodiment, the lens function section 12a functioning as a convex lens is provided in a region close to one of four sides of the lens component 12 (see FIG. 1). The lens component 12 includes, for example, an optical glass material such as BK7 or a resin material such as acrylic resin and polycarbonate resin.

In addition, in the embodiment, a visible outline on a side of the lens function section 12a of the lens component 12 is disposed outside a visible outline of the frame region 11b of the liquid crystal display panel 11 (see FIG. 2). In other words, the lens component 12 is disposed such that an outer end on the side of the lens function section 12a of the lens component 12 is located outside an outer end (outline) of the entire liquid crystal display panel 11 (both the effective display region 11a and the frame region 11b).

[Method of Manufacturing Liquid Crystal Display 1]

The liquid crystal display 1 is manufactured, for example, in the following manner. Specifically, the liquid crystal display panel 11 is formed to have the effective display region 11a and the frame region 11b. In detail, the substrate 110A as a TFT substrate and the substrate 110B as a CF substrate are formed with use of a glass substrate and others, and then liquid crystal is introduced into a space between the substrates 110A and 110B to form the liquid crystal layer 112a. In addition, the light-shielding film 112b is formed on the frame region 11b between the substrates 110A and 110B. In this way, the liquid crystal display panel 11 is formed.

The backlight 10 is then disposed on a back side of the liquid crystal display panel 11, and the lens component 12 having the lens function section 12a is formed on the viewing surface side of the liquid crystal display panel 11. In detail, such a lens component 12 is formed with use of acrylic resin, for example, and then the lens component 12 is bonded to the liquid crystal display panel 11 with the resin layer 13 therebetween. In this operation, as described above, the visible outline on the side of the lens function section 12a of the lens component 12 is disposed outside the visible outline of the frame region 11b of the liquid crystal display panel 11. This is the end of manufacturing of the liquid crystal display 1 shown in FIGS. 1 and 2.

[Functions and Effects of Liquid Crystal Display 1]
(Basic Operation)

In the liquid crystal display 1, as shown in FIGS. 1 and 2, light emitted from the backlight 10, for example, illumination light L10 and illumination light L20, is modulated at individual pixels in the liquid crystal display panel 11 according to control by a drive circuit (not shown). As a result, display light L1, for example, display light L11 and display light L21, is emitted from the viewing surface side of the liquid crystal display panel 11, and enters the lens component 12. The display light L1 (display light L11 and display light L21) is emitted to the outside as display light L2, for example, display light L12 and display light L22, from the lens component 12. In this way, the liquid crystal display 1 performs image display.

In this operation, as shown in FIG. 2, the display light L11 and the display light L21 are each emitted from a frame region 11b side of the effective display region 11a, and are changed in an optical path by the lens function section 12a of the lens component 12, and then are emitted to the outside as the display light L12 and the display light L22. In detail, the display light L11 and the display light L21, which are obliquely incident on the lens component 12 toward the outside of the lens component 12, are refracted by the lens function section 12a, so that an optical path of each display light is changed into a thickness direction (vertical direction) of the liquid crystal display 1 and then emitted to a region close to a viewer. In this way, a viewer also sees display light emitted from the frame region 11b, resulting in a function of pseudo frame-size reduction.

Comparative Example

Figure 3:
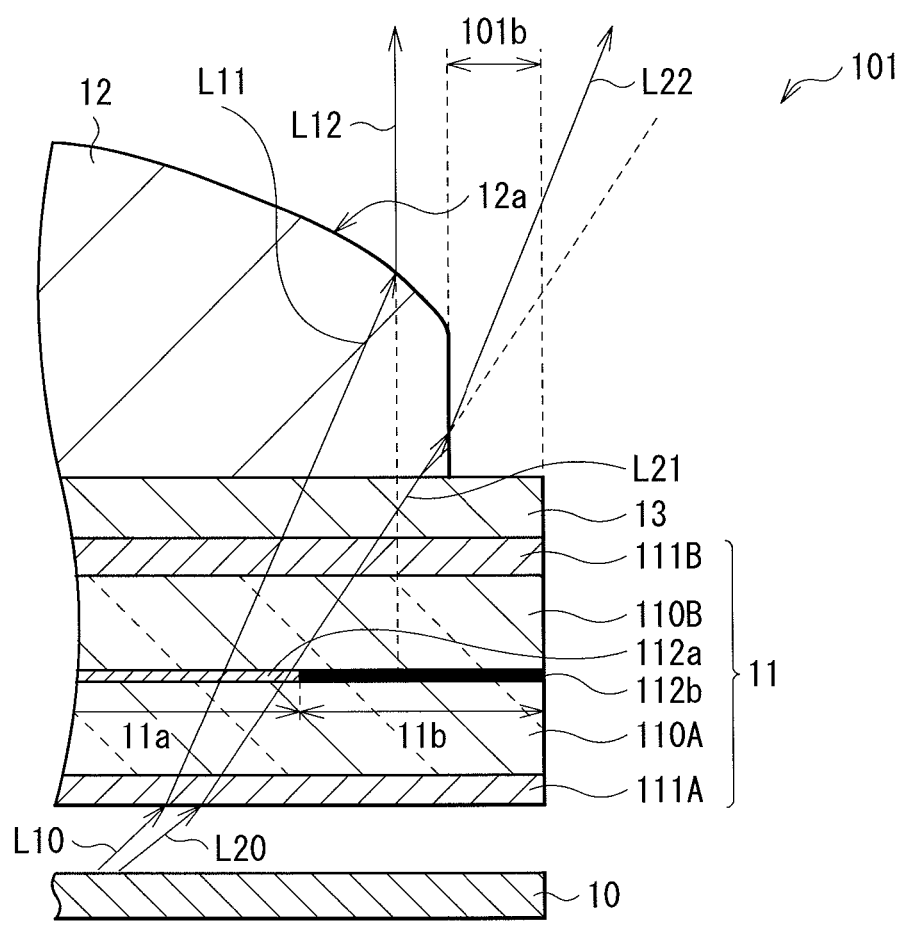
FIG. 3 is a sectional view illustrating an exemplary configuration of a display according to a comparative example.

FIG. 3 schematically illustrates a sectional configuration of a display (liquid crystal display 101) according to a comparative example. The liquid crystal display 101 according to the comparative example includes a backlight 10, a liquid crystal display panel 11, a resin layer 13, and a lens component 12 in this order from a back side to a viewing surface side of the liquid crystal display 101, as in the liquid crystal display 1 according to the embodiment.

The liquid crystal display 101 is, however, different from the liquid crystal display 1 in that a visible outline on a side of a lens function section 12a of the lens component 12 is located on a frame region 11b of the liquid crystal display panel 11. In other words, the visible outline on the side of the lens function section 12a of the lens component 12 is disposed outside a visible outline of the effective display region 11a of the liquid crystal display panel 11, but disposed inside a visible outline of the frame region 11b of the liquid crystal display panel 11.

Accordingly, in the liquid crystal display 101, part of display light (for example, display light L21 shown in FIG. 3), which is obliquely incident on the lens component 12 toward the outside of the lens component 12, is refracted by a side-face side of the lens component 12 rather than by the lens function section 12a of the lens component 12. As a result, an optical path of part of display light (for example, display light L21), which is emitted from a frame region 11b side of the effective display region 11a, is not changed into a thickness direction (vertical direction) of the liquid crystal display 1, and thus the part of display light is emitted to a laterally outer side of the liquid crystal display 101. Specifically, display light changed in an optical path by the lens component 12 (lens function section 12a) hardly arrives at a region close to a viewer depending on an emission source site in the effective display region 11a. As a result, the viewer sees part of the frame region 11b, or part of a peripheral region, (here, a region 101b shown in FIG. 3) as a dark region. In other words, the liquid crystal display 101 has an insufficient function of the pseudo frame-size reduction using the lens component 12 (lens function section 12a).

(Function of the Embodiment)

In contrast, in the liquid crystal display 1 according to the embodiment, as shown in FIG. 2, the visible outline on the side of the lens function section 12a of the lens component 12 is disposed outside the visible outline of the frame region 11b of the liquid crystal display panel 11. In other words, the lens component 12 is disposed such that the outer end on the side of the lens function section 12a of the lens component 12 is located outside the outer end of the entire liquid crystal display panel 11 (both the effective display region 11a and the frame region 11b).

Consequently, an optical path of display light (herein, the display light L11 and the display light L21), which is emitted from a frame region 11b side of the effective display region 11a, is readily changed into a direction toward a region close to a viewer by the lens function section 12a. Specifically, unlike in the comparative example, display light changed in an optical path by the lens component 12 (lens function section 12a) generally readily arrives at a region close to a viewer regardless of an emission source site in the effective display region 11a. As a result, in the embodiment, the function of pseudo frame-size reduction by the lens function section 12a is enhanced, namely, dark regions are hardly seen in frame region 11b, unlike in the comparative example where part of display light (for example, the display light L21) hardly arrives at a region close to a viewer.

As described above, in the embodiment, the visible outline on the side of the lens function section 12a of the lens component 12 is disposed outside the visible outline of the frame region 11b of the liquid crystal display panel 11; hence, display light emitted from the effective display region 11a is generally allowed to readily arrive at a region close to a viewer. This leads to enhancement of the function of pseudo frame-size reduction by the lens function section 12a, thus achieving a smaller frame size than in the past.

In addition, for example, in the case where a plurality of liquid crystal display panels 11 are arranged in the liquid crystal display 1, joints between adjacent liquid crystal display panels 11 (frame regions between liquid crystal display panels 11) are allowed to be hardly seen, leading to an improvement in image quality.

Modifications

Modifications (Modifications 1 to 7) of the embodiment will now be described. It is to be noted that the same components as those in the embodiment are designated by the same numerals, and description of them is appropriately omitted.

Modification 1

Figure 4:
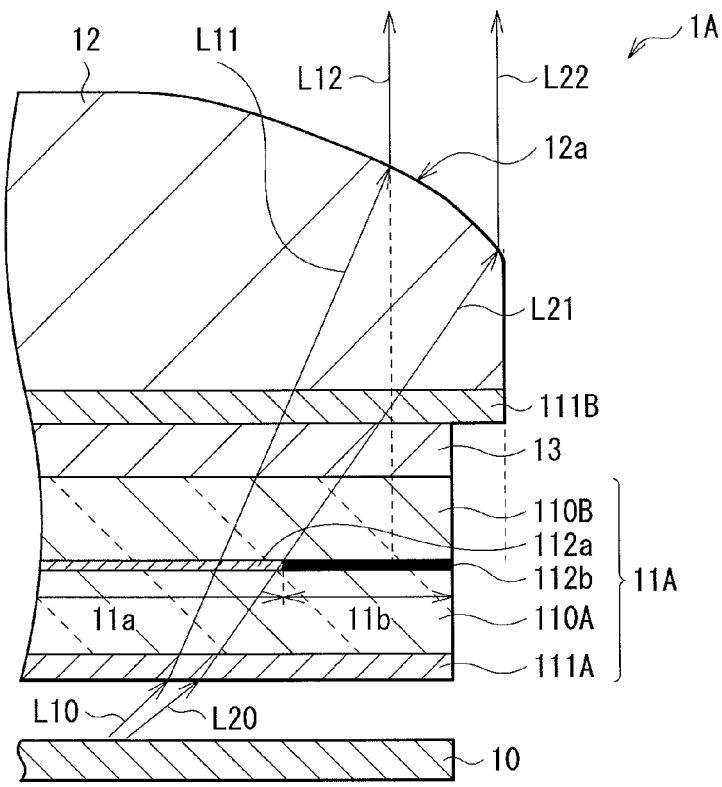
FIG. 4 is a sectional view illustrating an exemplary configuration of a display according to Modification 1.

FIG. 4 schematically illustrates an exemplary sectional configuration of a display (liquid crystal display 1A) according to Modification 1. The liquid crystal display 1A according to Modification 1 includes a backlight 10, a liquid crystal display panel 11A, a resin layer 13, a polarizing plate 111B, and a lens component 12 in this order from a back side to a viewing surface side of the liquid crystal display 1A. The liquid crystal display panel 11A includes a polarizing plate 111A, a substrate 110A, a liquid crystal layer 11a and a light-shielding layer 11b, and a substrate 110B from a back side to a viewing surface side of the liquid crystal display panel 11A.

Specifically, the liquid crystal display 1A has the same configuration as that of the liquid crystal display 1 according to the embodiment except that the output-side polarizing plate 111B is provided between the resin layer 13 and the lens component 12 instead of being provided in the liquid crystal display panel 11 (between the substrate 110B and the resin layer 13). In detail, this polarizing plate 111B is attached (bonded) to the lens component 12 on a back side (on a side of the liquid crystal display panel 11) of the lens component 12.

According to such a configuration, the liquid crystal display 1A according to Modification 1 has the following effect in addition to the same advantageous effect as in the embodiment. Specifically, in Modification 1, the polarizing plate 111B is bonded to the back side of the lens component 12, and thus a visible outline of the polarizing plate 111B is located outside a visible outline of the liquid crystal display panel 11A. Consequently, in Modification 1, the polarizing plate 111B is allowed to be disposed at a large tolerance compared with in the embodiment, thus achieving further frame-size reduction corresponding to such increased bonding tolerance of the polarizing plate 111B.

Modification 2

Figure 5:
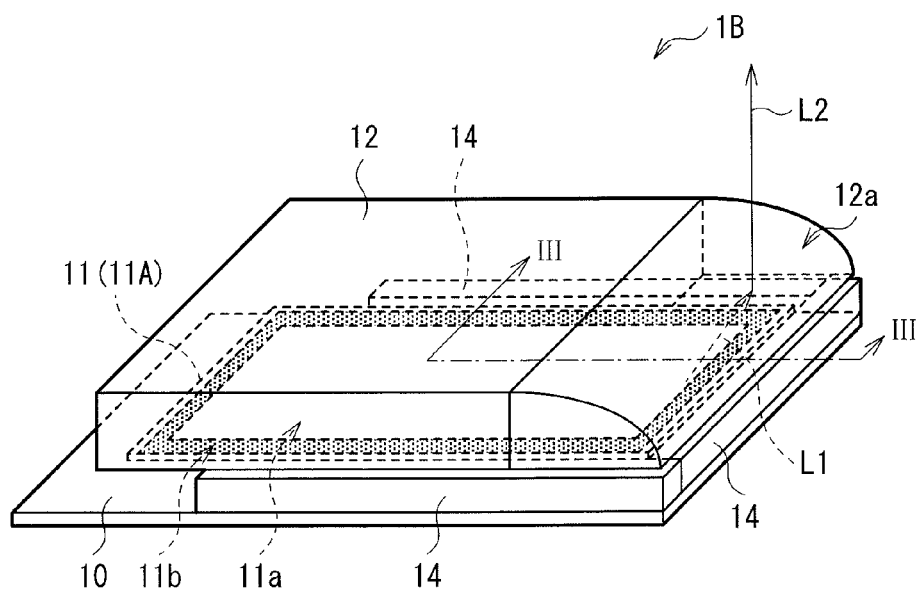
FIG. 5 is a perspective view illustrating an exemplary appearance configuration of a display according to Modification 2.

FIG. 5 is a perspective view schematically illustrating an appearance configuration of a display (liquid crystal display 1B) according to Modification 2. FIGS. 6A and 6B each illustrate an exemplary sectional configuration (exemplary sectional configuration as viewed in an arrow direction along a III-III line in FIG. 5) of the liquid crystal display 1B.

As shown in FIG. 5, the liquid crystal display 1B according to Modification 2 has the same configuration as that of the liquid crystal display 1 according to the embodiment or the liquid crystal display 1A according to Modification 1 except that an outer casing (a housing or frame member) 14 is further provided around part or all of the liquid crystal display panel 11 or 11A. It is to be noted that such an outer casing 14 includes, for example, a metal material such as aluminum and stainless steel.

In detail, an exemplary liquid crystal display 1B shown in FIG. 6A includes a backlight 10, a liquid crystal display panel 11, a resin layer 13, and a lens component 12 in this order from a back side to a viewing surface side of the liquid crystal display 1B. In addition, the outer casing 14 is vertically provided on part of an outer end region of the backlight 10. In other words, the outer casing 14 is physically connected to the backlight 10. In addition, the lens component 12 is supported by the outer casing 14 at an outer end region of the lens function section 12a. Specifically, the liquid crystal display 1B shown in FIG. 6A corresponds to a display defined by adding the outer casing 14 in the liquid crystal display 1.

An exemplary liquid crystal display 1B shown in FIG. 6B includes a backlight 10, a liquid crystal display panel 11A, a resin layer 13, a polarizing plate 111B, and a lens component 12 in this order from a back side to a viewing surface side of the liquid crystal display 1B. In addition, as in FIG. 6A, the lens component 12 is supported by the outer casing 14 at an outer end region of the lens function section 12a. Specifically, the liquid crystal display 1B shown in FIG. 6B corresponds to a display defined by adding the outer casing 14 in the liquid crystal display 1A.

In the liquid crystal display 1B according to Modification 2, the lens component 12 is supported by the outer casing 14 at the outer end region of the lens function section 12a as above; hence, the liquid crystal display 1B has the following effect in addition to the same advantageous effects as those of the liquid crystal displays 1 and 1A. Specifically, if the lens component 12 is disposed over the frame region 11b, a space to support the lens component 12 is hardly defined due to a physically small frame size, leading to a possibility of reduction in mechanical strength of the liquid crystal display. In detail, if the liquid crystal display panel 11 deflects, strength may be practically reduced at a relatively high possibility. The outer casing 14 being originally provided is allowed to function as a support member of the lens component 12, thereby enabling an increase in mechanical strength of the liquid crystal display 1B without a special support member, namely, without increasing component cost.

Modification 3

Figure 7A:
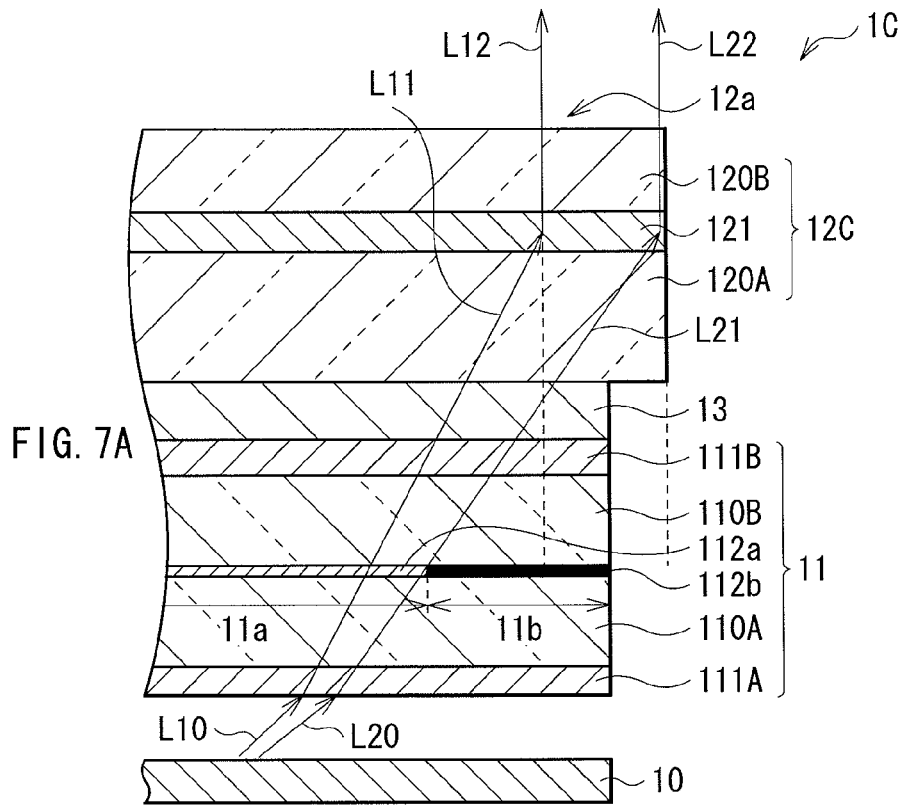
FIGS. 7A and 7B are each a sectional view illustrating an exemplary configuration of a display according to Modification 3.
Figure 7B:
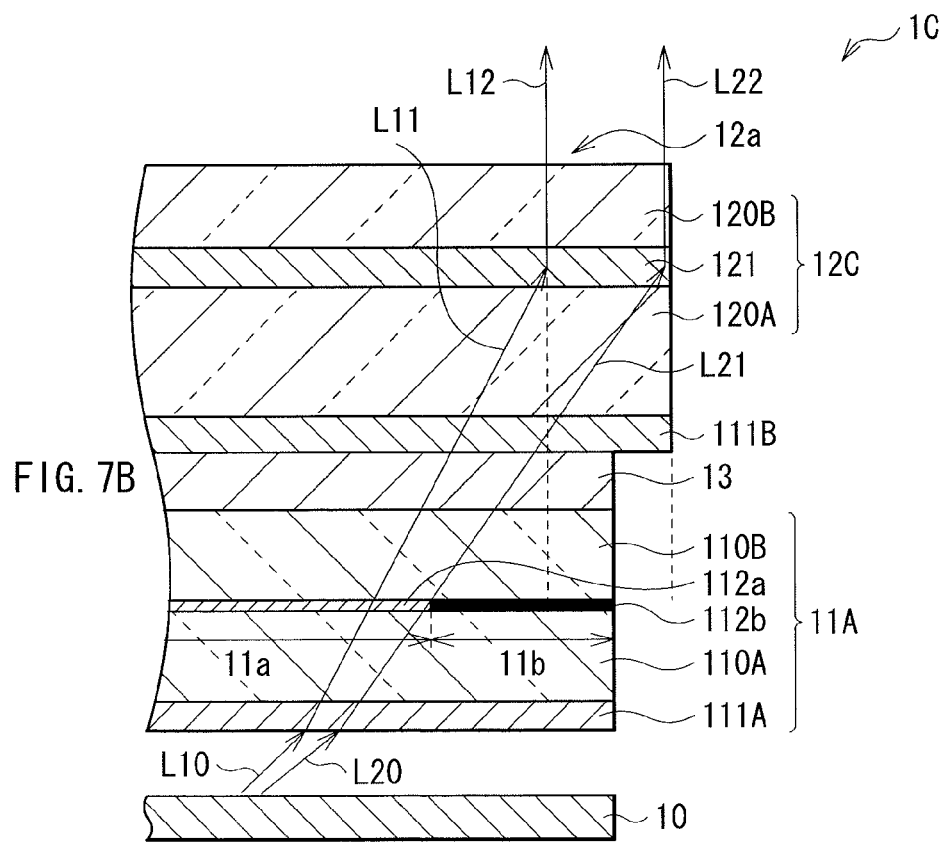

FIGS. 7A and 7B each schematically illustrate an exemplary sectional configuration of a display (liquid crystal display 1C) according to Modification 3. The liquid crystal display 1C according to Modification 3 has the same configuration as that of the liquid crystal display 1 according to the embodiment or the liquid crystal display 1A according to Modification 1 except that a lens component 12C including a liquid crystal lens is provided in place of the lens component 12 including optical glass.

In detail, an exemplary liquid crystal display 1C shown in FIG. 7A includes a backlight 10, a liquid crystal display panel 11, a resin layer 13, and the lens component 12C in this order from a back side to a viewing surface side of the liquid crystal display 1C. Specifically, the liquid crystal display 1C shown in FIG. 7A corresponds to a display defined by substituting the lens component 12C for the lens component 12 in the liquid crystal display 1.

On the other hand, an exemplary liquid crystal display 1C shown in FIG. 7B includes a backlight 10, a liquid crystal display panel 11A, a resin layer 13, a polarizing plate 111B, and a lens component 12 in this order from a back side to a viewing surface side of the liquid crystal display 1C. Specifically, the liquid crystal display 1C shown in FIG. 7B corresponds to a display defined by substituting the lens component 12C for the lens component 12 in the liquid crystal display 1A.

(Lens Component 12C)

The lens component 12C includes a liquid crystal lens (for example, a UV-curable liquid crystal lens described below) as described above, and has a substrate 120A, a liquid crystal layer 121, and a substrate 120B in this order from a back side to a viewing surface side of the lens component 12C. In other words, the lens component 12C has a configuration where the liquid crystal layer 121 is held between a pair of substrates 120A and 120B.

The substrates 120A and 120B are each a light-transmissive substrate including, for example, a glass substrate. The liquid crystal layer 121 includes liquid crystal molecules aligned in a predetermined direction. For example, in the case of a UV-curable liquid crystal lens, the liquid crystal layer 121 includes a UV-curable polymer in addition to the liquid crystal molecules.

The lens component 12C having such a configuration, which is, for example, a UV-curable liquid crystal lens, is manufactured in the following manner. Specifically, a predetermined voltage is applied between electrodes (not shown) provided on the respective substrates 120A and 120B to align the liquid crystal molecules in the liquid crystal layer 121 in a predetermined direction. In this state, ultraviolet rays are then applied to the liquid crystal layer 121 to cure the polymer in the liquid crystal layer 121 so that an alignment direction of each liquid crystal molecule is fixed, namely, an alignment state of each liquid crystal molecule is prevented from varying while no voltage is applied between the electrodes. This is the end of manufacturing of the lens component 12C including the UV-curable liquid crystal lens.

For example, a lens component 12C shown in the left of FIG. 8A has an alignment structure where alignment of liquid crystal molecules LC is gradually changed from vertical alignment to horizontal alignment from an outer end to the inside of the lens component 12C. In the case of such an alignment structure, as shown in the right of FIG. 8A, the lens component 12C functions as a convex lens.

On the other hand, a lens component 12C shown in the left of FIG. 8B has an alignment structure where alignment of liquid crystal molecules LC is gradually changed from horizontal alignment to vertical alignment from an outer end to the inside of the lens component 12C. In the case of such an alignment structure, as shown in the right of FIG. 8B, the lens component 12C functions as a concave lens.

In the liquid crystal display 1C according to Modification 3, which has the lens component 12C having such a configuration, a visible outline on a side of a lens function section 12a of the lens component 12C is also disposed outside a visible outline of a frame region 11b of the liquid crystal display panel 11. Hence, the same advantageous effects as in the embodiment or Modification 1 are provided through the same functions.

Modification 4

FIGS. 9A and 9B each schematically illustrate an exemplary sectional configuration of a display (liquid crystal display 1D) according to Modification 4. The liquid crystal display 1D according to Modification 4 has the same configuration as that of the liquid crystal display 1C according to Modification 3 except that the outer casing 14 described in Modification 2 is further provided.

In detail, an exemplary liquid crystal display 1D shown in FIG. 9A includes a backlight 10, a liquid crystal display panel 11, a resin layer 13, and a lens component 12C in this order from a back side to a viewing surface side of the liquid crystal display 1D. In addition, the lens component 12C is supported by the outer casing 14 at an outer end region of the lens function section 12a. Specifically, the liquid crystal display 1D shown in FIG. 9A corresponds to a display defined by adding the outer casing 14 in the liquid crystal display 1C shown in FIG. 7A.

An exemplary liquid crystal display 1D shown in FIG. 9B includes a backlight 10, a liquid crystal display panel 11A, a resin layer 13, a polarizing plate 111B, and a lens component 12C in this order from a back side to a viewing surface side of the liquid crystal display 1D. In addition, as in FIG. 9A, the lens component 12C is supported by the outer casing 14 at an outer end region of the lens function section 12a. Specifically, the liquid crystal display 1D shown in FIG. 7B corresponds to a display defined by adding the outer casing 14 in the liquid crystal display 1C shown in FIG. 7B.

In the liquid crystal display 1D according to Modification 4, the lens component 12C is supported by the outer casing 14 at the outer end region of the lens function section 12a as above; hence, the same advantageous effects as in Modification 2 are provided through the same functions.

Modification 5

(Configuration of Organic EL Display 2)

Figure 10A:
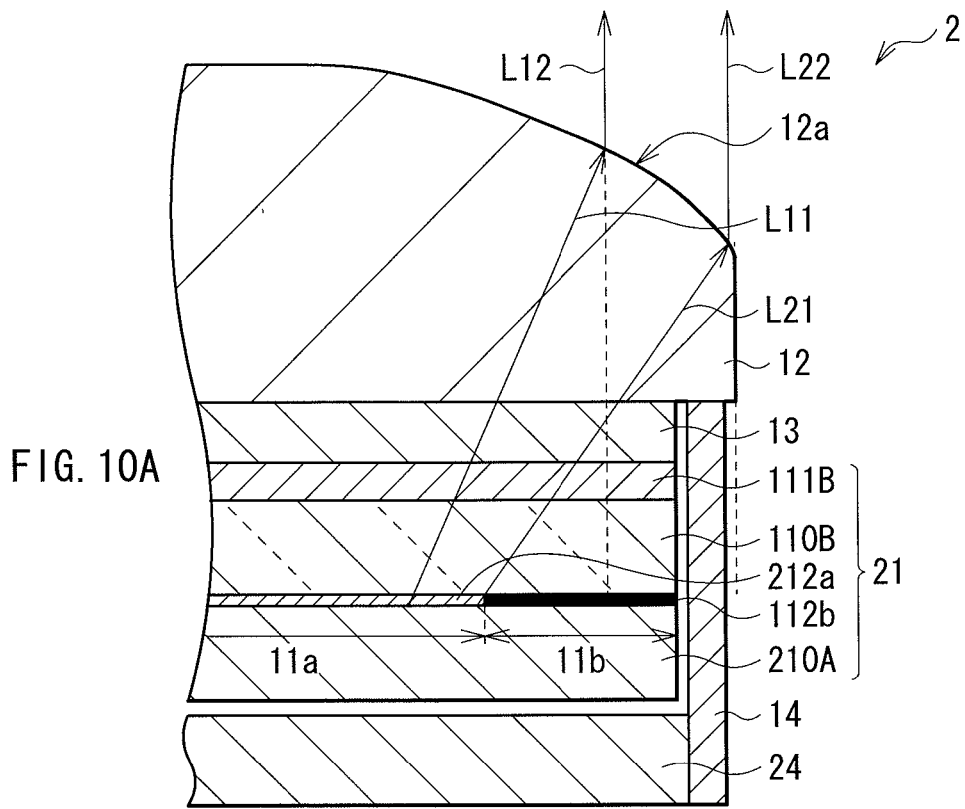
FIGS. 10A and 10B are each a sectional view illustrating an exemplary configuration of a display according to Modification 5.
Figure 10B:
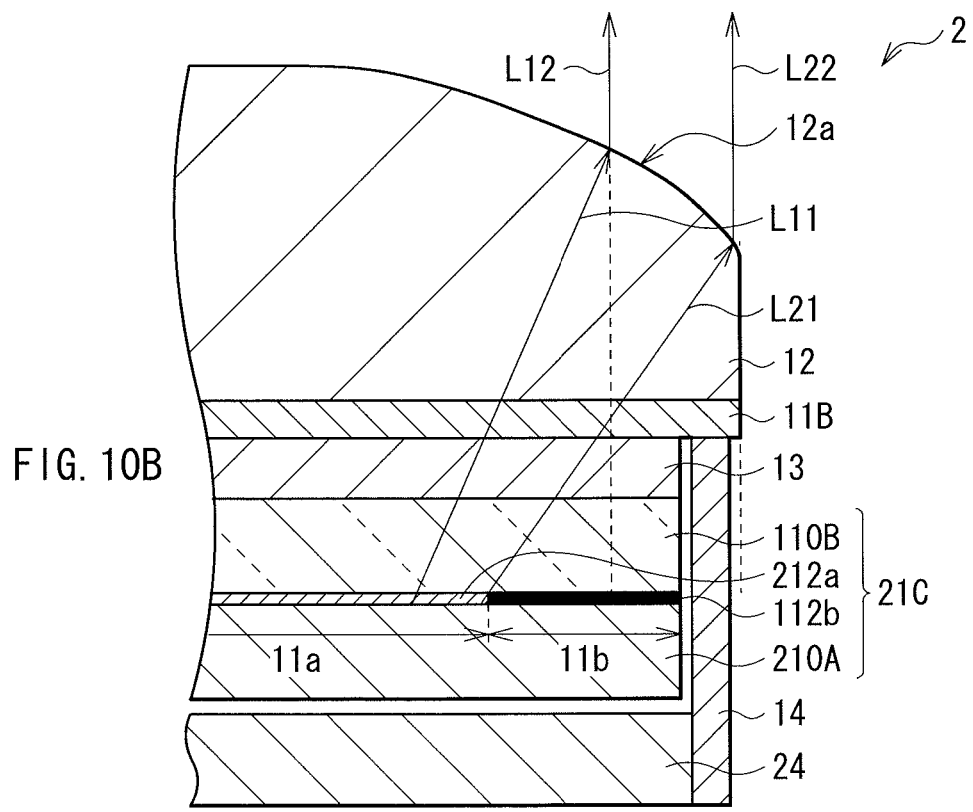

FIGS. 10A and 10B each schematically illustrate an exemplary sectional configuration of a display (organic EL display 2) according to Modification 5. In Modification 5, an organic EL display is used as an exemplary display in place of the liquid crystal display described hereinbefore.

In detail, an exemplary organic EL display 2 shown in FIG. 10A includes an outer casing 24, an organic EL display panel 21, a resin layer 13, and a lens component 12 in this order from a back side to a viewing surface side of the organic EL display 2. In addition, the lens component 12 is supported by an outer casing 14 at an outer end region of the lens function section 12a. Specifically, the organic EL display 2 shown in FIG. 10A corresponds to a display defined by substituting the organic EL display panel 21 for the liquid crystal display panel 11 in the liquid crystal display 1B shown in FIG. 6A The outer casing 24 is provided on a back side of the organic EL display panel 21, and the outer casing 14 is vertically provided so as to be connected to a peripheral region of the outer casing 24. According to such a configuration, the organic EL display panel 21 is accommodated by the outer casings 14 and 24. Specifically, in this case, the outer casings 14 and 24 function as a housing of the organic EL display panel 21. It is to be noted that such an outer casing 24 also includes, for example, a metal material such as aluminum and stainless steel.

The organic EL display panel 21 is a display panel including organic EL devices, and includes an effective display region 11a including a plurality of pixels (not shown), and a frame region 11b located at the periphery of the effective display region 11a, as in the liquid crystal display panel 11. In addition, the organic EL display panel 21 has a stacked structure including a substrate 210A, an organic EL layer 212a and a light-shielding film 112b, a substrate 110B, and a polarizing plate 111B from a back side (an outer casing 24 side) to a viewing surface side (lens component 12 side) of the organic EL display panel 21. It is to be noted that the polarizing plate 111B is used to suppress reflection of outside light herein, and is not necessarily provided depending on situations.

The substrate 210A is a light-reflective substrate (TFT substrate) herein, and includes, for example, a semiconductor substrate or a glass substrate. The organic EL layer 212a is interposed between the substrates 210A and 110B, and defines the organic EL devices in the effective display region 11a. In detail, the organic EL layer 212a includes organic layers including a luminescent layer, for example, including a hole injection layer, a hole transport layer, the luminescent layer, an electron transport layer, and an electron injection layer.

On the other hand, an exemplary organic EL display 2 shown in FIG. 10B includes an outer casing 24, an organic EL display panel 21C, a resin layer 13, a polarizing plate 111B, and a lens component 12 in this order from a back side to a viewing surface side of the organic EL display 2. In addition, as in FIG. 10A, the lens component 12 is supported by an outer casing 14 at an outer end region of the lens function section 12a. Specifically, the organic EL display 2 shown in FIG. 10B corresponds to a display defined by substituting the organic EL display panel 21C for the liquid crystal display panel 11A in the liquid crystal display 1B shown in FIG. 6B.

The organic EL display panel 21C corresponds to a configuration defined by removing the polarizing plate 111B from the organic EL display panel 21. The polarizing plate 111B is provided between the resin layer 13 and the lens component 12 as described above. Specifically, the polarizing plate 111B is bonded to a back side (the organic EL display panel 21C side) of the lens component 12, herein.

(Method of Manufacturing Organic EL Display 2)

The organic EL display 2 having such a configuration is manufactured, for example, in the following manner. Specifically, the organic EL display panel 21 or 21C is formed to have the effective display region 11a and the frame region 11b. The organic EL display panel 21 or 21C is then accommodated by the outer casings 14 and 21, and the lens component 12 having the lens function section 12a is formed on the viewing surface side of the organic EL display panel 21 or 21C. At that time, in Modification 5, a visible outline on the side of the lens function section 12a of the lens component 12 is also disposed outside a visible outline of the frame region 11b of the organic EL display panel 21 or 21C. This is the end of manufacturing of the organic EL display 2 shown in FIGS. 10A and 10B.

(Functions and Effects of Organic EL Display 2)

In the organic EL display 2 according to Modification 5, luminescent light (for example, display light L11 and display light L21) is emitted from the viewing surface side of the organic EL display panel 21 or 21C according to control by a drive circuit (not shown), and enters the lens component 12. The display light L11 and the display light L21 are emitted to the outside as display light L12 and display light L22 from the lens component 12. In this way, the organic EL display 2 performs image display.

In Modification 5, as in the embodiment and others, a visible outline on the side of the lens function section 12a of the lens component 12 is disposed outside a visible outline of the frame region 11b of the organic EL display panel 21 or 21C; hence, the same advantageous effects as in the embodiment and others are provided through the same functions.

In Modification 5, the lens component 12 is also supported by the outer casing 14 at the outer end region of the lens function section 12a; hence, the same advantageous effects as in the embodiment and others are provided through the same functions.

It is to be noted that although Modification 5 has been described with a case where the outer casing 14 is provided, the outer casing 14 may not be provided, as in the embodiment.

Modification 6

Figure 11A:
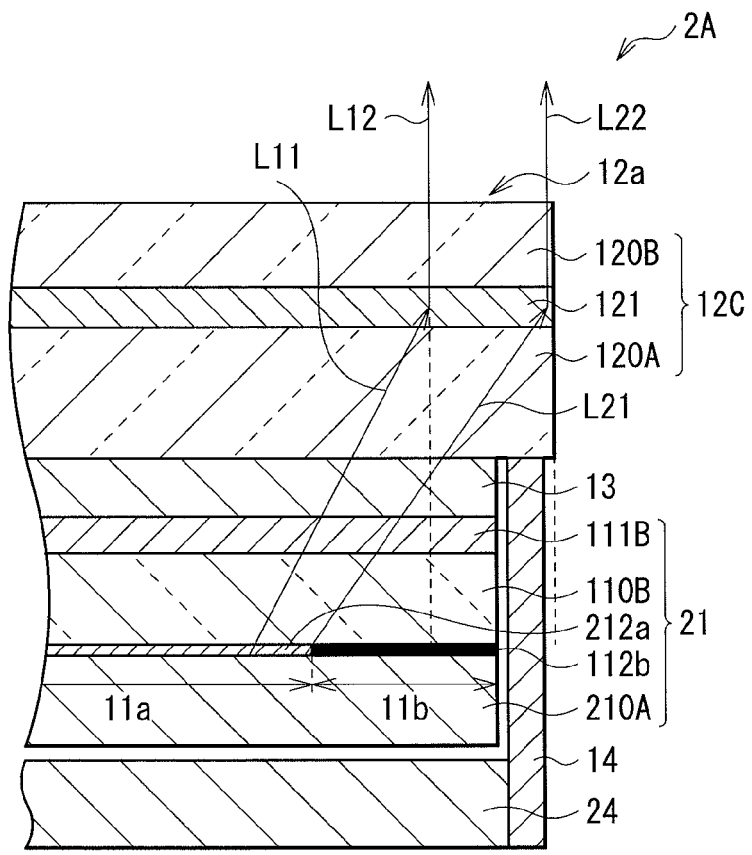
FIGS. 11A and 11B are each a sectional view illustrating an exemplary configuration of a display according to Modification 6.
Figure 11B:
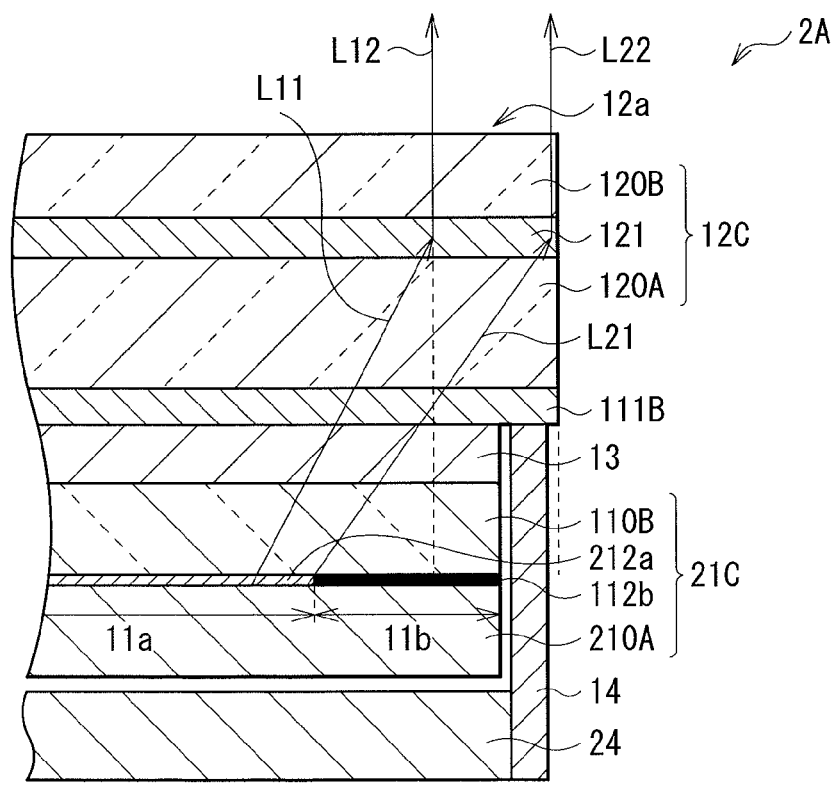

FIGS. 11A and 11B each schematically illustrate an exemplary sectional configuration of a display (organic EL display 2A) according to Modification 6. The organic EL display 2A according to Modification 6 has the same configuration as that of the organic EL display 2 according to Modification 5 except that the lens component 12C described in Modification 3 is provided in place of the lens component 12.

In detail, an exemplary organic EL display 2A shown in FIG. 11A includes an outer casing 24, an organic EL display panel 21, a resin layer 13, and a lens component 12C in this order from a back side to a viewing surface side of the organic EL display 2A. The lens component 12C is supported by an outer casing 14 at an outer end region of the lens function section 12a. Specifically, the organic EL display 2A shown in FIG. 11A corresponds to a display defined by substituting the lens component 12C for the lens component 12 in the organic EL display 2 shown in FIG. 10A.

On the other hand, an exemplary organic EL display 2A shown in FIG. 11B includes an outer casing 24, an organic EL display panel 21C, a resin layer 13, a polarizing plate 111B, and a lens component 12C in this order from a back side to a viewing surface side of the organic EL display 2A. In addition, the lens component 12C is supported by an outer casing 14 at an outer end region of the lens function section 12a. Specifically, the organic EL display 2A shown in FIG. 11B corresponds to a display defined by substituting the lens component 12C for the lens component 12 in the organic EL display 2 shown in FIG. 10B.

In the organic EL display 2A according to Modification 6, which has the lens component 12C having such a configuration, the same advantageous effects as in Modification 5 are also provided through the same functions.

It is to be noted that although Modification 6 has been also described with a case where the outer casing 14 is provided, the outer casing 14 may not be necessarily provided as in the embodiment.

Modification 7

Figure 12:
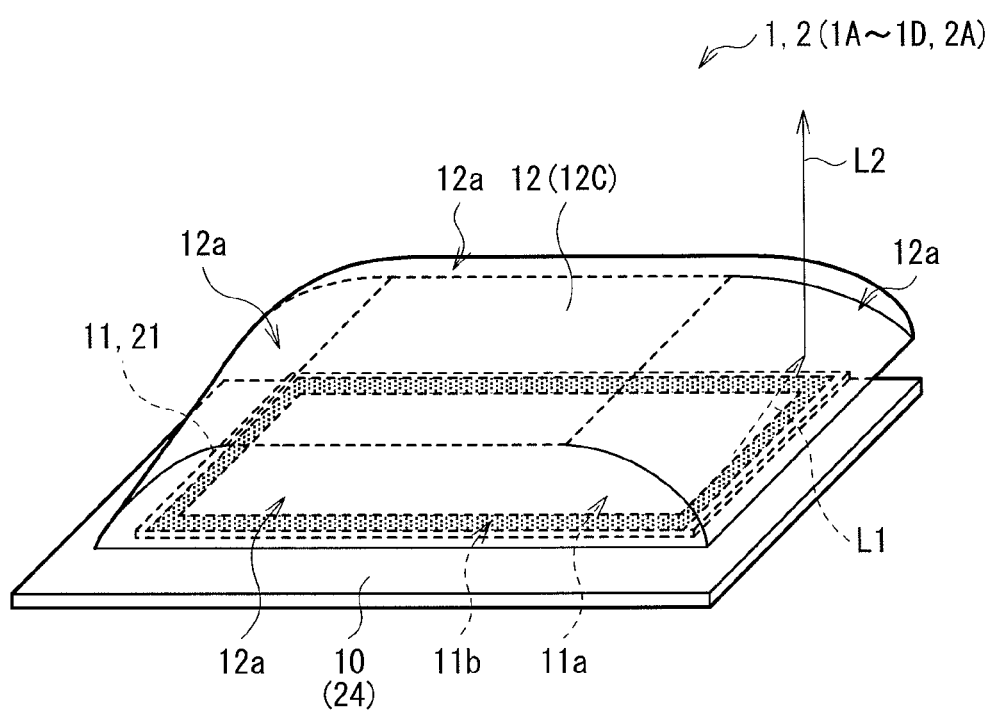
FIG. 12 is a perspective view illustrating an exemplary appearance configuration of a display according to Modification 7.

FIG. 12 is a perspective view schematically illustrating an appearance configuration of a display (a liquid crystal display or an organic EL display) according to Modification 7. The display according to Modification 7 corresponds to a display defined by modifying a shape of the lens component 12 or 12C in each of the liquid crystal displays 1 and 1A to 1D or each of the organic EL displays 2 and 2A described in the embodiment and Modifications 1 to 6. In detail, in Modification 7, the lens function section 12a is provided over the entire circumferential region of the lens component 12 or 12C (in regions close to all sides of the lens component 12 or 12C).

In this way, the lens function section 12a may be provided in a partial or the entire circumferential region (outer-end region) of the lens component 12 without limitation. In detail, for example, the lens function section 12a may be provided in regions close to two or three of the four sides of the lens component 12.

It is to be noted that although Modification 7 has been described with a case where the outer casing 14 is not provided, the outer casing 14 may be provided.

Application Examples

Application examples of each of the displays according to the embodiment and Modifications (Modifications 1 to 7) are now described with reference to FIGS. 13 to 17G. Each display according to the embodiment and others is applicable to electronic units in various fields, including a television apparatus, a digital camera, a notebook personal computer, a mobile terminal device such as a mobile phone, and a video camera. In other words, the display is applicable to electronic units in various fields which display externally-input or internally-generated video signals as still or video images.

Application Example 1

Figure 13:
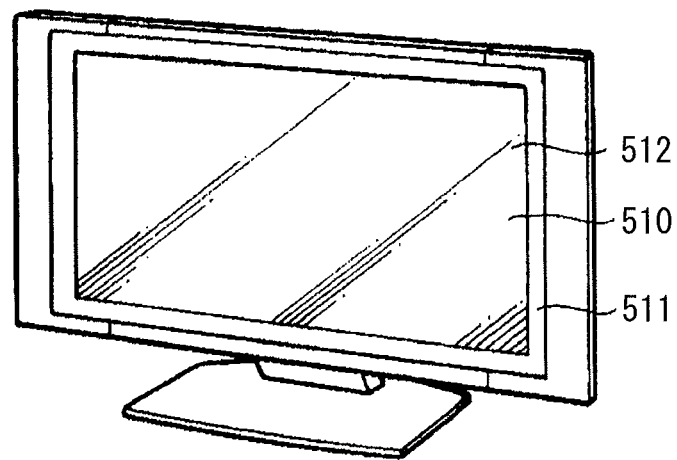
FIG. 13 is a perspective view illustrating appearance of an application example 1 of each display according to the embodiment and the Modifications.

FIG. 13 shows appearance of a television apparatus to which the display according to the embodiment and others is applied. The television apparatus has, for example, an image display screen section 510 including a front panel 511 and filter glass 512. The image display screen section 510 is configured of the display according to the embodiment and others.

Application Example 2

Figure 14A:
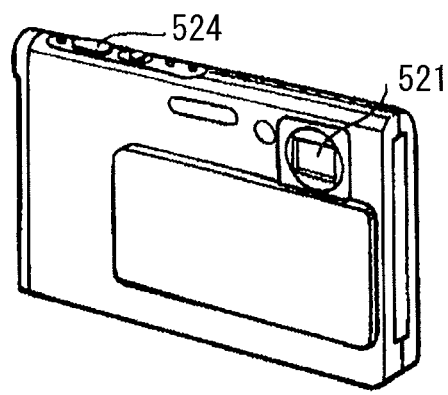
FIG. 14A is a perspective view illustrating appearance of an application example 2 as viewed from its front side.
Figure 14B:
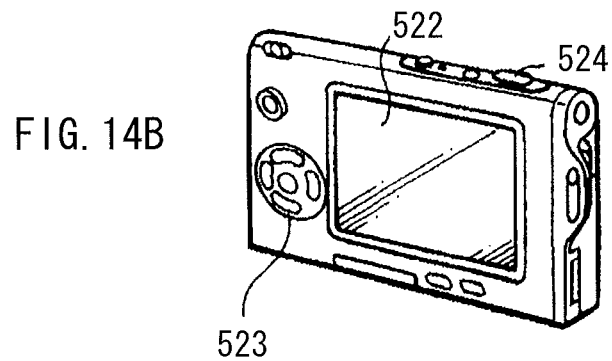
FIG. 14B is a perspective view illustrating appearance thereof as viewed from its back side.

FIGS. 14A and 14B each show appearance of a digital camera to which the display according to the embodiment and others is applied. The digital camera has, for example, a light emitting section 521 for flash, a display section 522, a menu switch 523, and a shutter button 524. The display section 522 is configured of the display according to the embodiment and others.

Application Example 3

Figure 15:
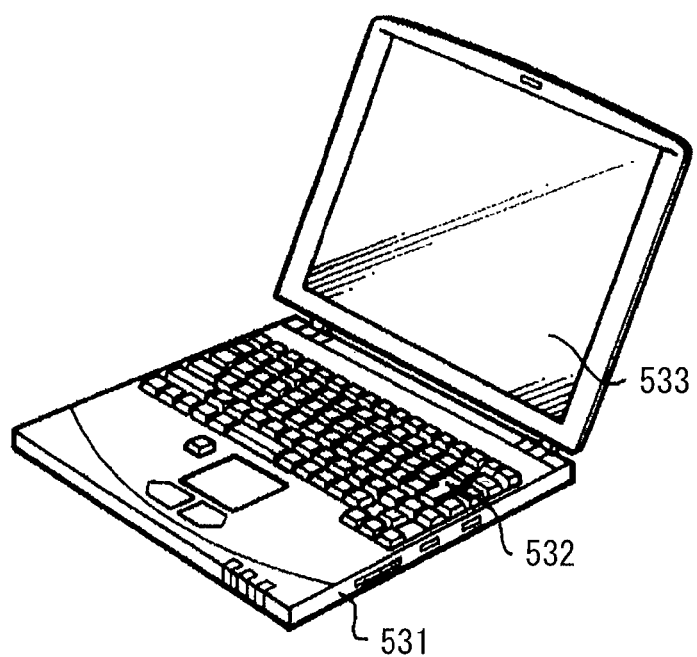
FIG. 15 is a perspective view illustrating appearance of an application example 3.

FIG. 15 shows appearance of a notebook personal computer to which the display according to the embodiment and others is applied. The notebook personal computer has, for example, a main body 531, a keyboard 532 for input operation of characters and the like, and a display section 533 that displays images. The display section 533 is configured of the display according to the embodiment and others.

Application Example 4

Figure 16:
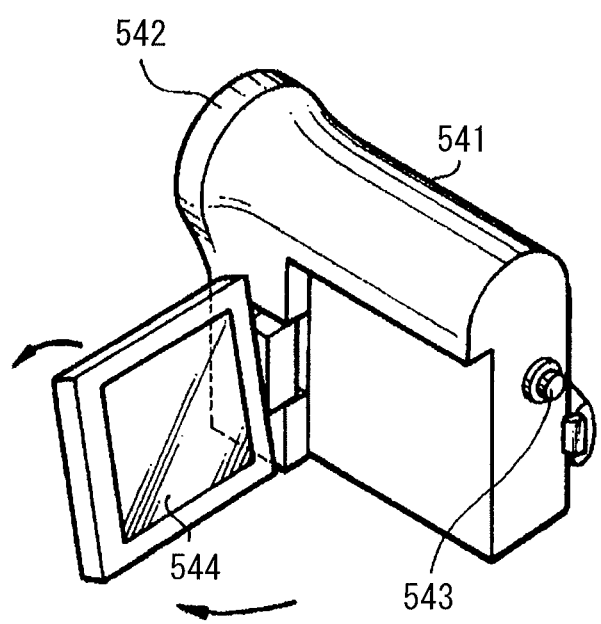
FIG. 16 is a perspective view illustrating appearance of an application example 4.

FIG. 16 shows appearance of a video camera to which the display according to the embodiment and others is applied. The video camera has, for example, a main body section 541, an object-shooting lens 542 provided on a front side face of the main body section 541, a start/stop switch 543 for shooting, and a display section 544. The display section 544 is configured of the display according to the embodiment and others.

Application Example 5

FIGS. 17A to 17G each show appearance of a mobile phone to which the display according to the embodiment and others is applied. For example, the mobile phone is configured of an upper housing 710 and a lower housing 720 connected to each other by a hinge section 730, and has a display 740, a sub display 750, a picture light 760, and a camera 770. The display 740 or the sub display 750 is configured of the display according to the embodiment and others.

Other Modifications

While the technology of the present disclosure has been described with the embodiment and Modifications hereinbefore, the technology may be variously modified or altered without being limited to the embodiment and others.

For example, although the embodiment and others have been described with a case where the lens function section of the lens component mainly functions as a convex lens, the lens function section may function as a concave lens without limitation.

In addition, although the embodiment and others have been described with an exemplary display (a liquid crystal display or an organic EL display) having a liquid crystal display panel or an organic EL display panel as an exemplary display panel, this is not limitative. Specifically, the present technology is allowed to be applied to a display having another type of display panel, such as an inorganic EL panel and a plasma display panel (PDP).

It is to be noted that the disclosure may be configured as follows.

(1) A display including:
a display panel having an effective display region and a frame region located at the periphery of the effective display region; and
a lens component provided on a viewing surface side of the display panel, the lens component having a lens function section in part or all of a circumferential region thereof,
wherein a visible outline on a lens-function-section side of the lens component is disposed outside a visible outline of the frame region of the display panel.

(2) The display according to (1),
wherein an outer casing is provided around the display panel, and
the lens component is supported by the outer casing at an outer end region of the lens function section.

(3) The display according to (2), further including:
a liquid crystal display panel as the display panel; and
a light source section provided on a back side of the liquid crystal display panel,
wherein the outer casing is connected to the light source section.

(4) The display according to (2),
wherein the display panel is an organic EL display panel, and
the organic EL display panel is accommodated by the outer casing.

(5) The display according to any one of (1) to (4),
wherein the display panel is a liquid crystal display panel including a pair of substrates, a liquid crystal layer interposed between the substrates, and an incident-side polarizing plate, and
an emission-side polarizing plate is bonded to the lens component on a side of the liquid crystal display panel of the lens component.

(6) The display according to any one of (1) to (5),
wherein the lens component is configured of a liquid crystal lens.

(7) The display according to any one of (1) to (6),
wherein the lens function section is provided over the entire circumferential region of the lens component.

(8) An electronic unit including a display, the display including:
a display panel having an effective display region and a frame region located at the periphery of the effective display region; and
a lens component provided on a viewing surface side of the display panel, the lens component having a lens function section in part or all of a circumferential region thereof, wherein a visible outline on a lens-function-section side of the lens component is disposed outside a visible outline of the frame region of the display panel.

(9) A method of manufacturing a display including:
forming a display panel having an effective display region and a frame region located at the periphery of the effective display region; and
forming a lens component on a viewing surface side of the display panel, the lens component having a lens function section in part or all of a circumferential region thereof,
wherein a visible outline on a lens-function-section side of the lens component is disposed outside a visible outline of the frame region of the display panel.

The present disclosure contains subject matter related to that disclosed in Japanese Priority Patent Application JP 2011-154971 filed in the Japan Patent Office on Jul. 13, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display comprising:
a display panel having an effective display region and a frame region located at the periphery of the effective display region; and
a lens component provided on a viewing surface side of the display panel, the lens component having a lens function section in part or all of a circumferential region thereof,
wherein a visible outline on a lens-function-section side of the lens component is disposed outside a visible outline of the frame region of the display panel.

2. The display according to claim 1,
wherein an outer casing is provided around the display panel, and
the lens component is supported by the outer casing at an outer end region of the lens function section.

3. The display according to claim 2, further comprising:
a liquid crystal display panel as the display panel; and
a light source section provided on a back side of the liquid crystal display panel,
wherein the outer casing is connected to the light source section.

4. The display according to claim 2,
wherein the display panel is an organic EL display panel, and
the organic EL display panel is accommodated by the outer casing.

5. The display according to claim 1,
wherein the display panel is a liquid crystal display panel including a pair of substrates, a liquid crystal layer interposed between the substrates, and an incident-side polarizing plate, and
an emission-side polarizing plate is bonded to the lens component on a side of the liquid crystal display panel of the lens component.

6. The display according to claim 1,
wherein the lens component is configured of a liquid crystal lens.

7. The display according to claim 1,
wherein the lens function section is provided over the entire circumferential region of the lens component.

8. An electronic unit including a display, the display comprising:
a display panel having an effective display region and a frame region located at the periphery of the effective display region; and
a lens component provided on a viewing surface side of the display panel, the lens component having a lens function section in part or all of a circumferential region thereof,
wherein a visible outline on a lens-function-section side of the lens component is disposed outside a visible outline of the frame region of the display panel.

9. A method of manufacturing a display, comprising:
forming a display panel having an effective display region and a frame region located at the periphery of the effective display region; and
forming a lens component on a viewing surface side of the display panel, the lens component having a lens function section in part or all of a circumferential region thereof,
wherein a visible outline on a lens-function-section side of the lens component is disposed outside a visible outline of the frame region of the display panel.

* * * * *

UNITED STATES PATENT AND TRADEMARK OFFICE
CERTIFICATE OF CORRECTION

| | | |
|---|---|---|
| PATENT NO. | : 8,836,880 B2 | Page 1 of 1 |
| APPLICATION NO. | : 13/542783 | |
| DATED | : September 16, 2014 | |
| INVENTOR(S) | : Daisuke Takama et al. | |

It is certified that error appears in the above-identified patent and that said Letters Patent is hereby corrected as shown below:

On the title page item "(76)" should read --(75)--

On the title page add item (73), as follows:

Assignee: Japan Display West, Inc., Higashiura-Cho, Japan

Signed and Sealed this
Twenty-second Day of December, 2015

Michelle K. Lee
*Director of the United States Patent and Trademark Office*